(12) United States Patent
Koyama (10) Patent No.: US 9,773,859 B2
(45) Date of Patent: Sep. 26, 2017

(54) NON-VOLATILE MEMORY DEVICE (71) Applicant: Toshiba Memory Corporation, Minato-ku (JP)

(72) Inventor: Haruhiko Koyama, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/012,102

(22) Filed: Feb. 1, 2016

(65) Prior Publication Data

US 2017/0062551 A1    Mar. 2, 2017

Related U.S. Application Data

(60) Provisional application No. 62/210,033, filed on Aug. 26, 2015.

(51) Int. Cl.
| | |
|---|---|
| *H01L 49/02* | (2006.01) |
| *H01L 27/115* | (2017.01) |
| *H01L 27/11573* | (2017.01) |
| *H01L 27/11526* | (2017.01) |

(52) U.S. Cl.
CPC ........ *H01L 28/20* (2013.01); *H01L 27/11526* (2013.01); *H01L 27/11573* (2013.01)

(58) Field of Classification Search
None
See application file for complete search history.

(56) References Cited

U.S. PATENT DOCUMENTS

| | | | |
|---|---|---|---|
| 6,518,642 B2* | 2/2003 | Kim | H01L 21/76802 257/528 |
| 2012/0241845 A1* | 9/2012 | Kuroe | H01L 29/7881 257/324 |

* cited by examiner

*Primary Examiner* — Andres Munoz
(74) *Attorney, Agent, or Firm* — Oblon, McClelland, Maier & Neustadt, L.L.P.

(57) ABSTRACT

A non-volatile memory device comprises a memory area including a memory cell, and a peripheral area including a circuit that drives the memory cell. The circuit includes a first resistance element. The first resistance element includes a first conductive layer extending in a first direction, a first insulating layer provided on the first conductive layer, and a second conductive layer that includes a portion provided on the first insulating layer and an end portion in contact with the first conductive layer.

9 Claims, 11 Drawing Sheets

NON-VOLATILE MEMORY DEVICE

CROSS-REFERENCE TO RELATED APPLICATIONS

This application is based upon and claims the benefit of priority from U.S. Provisional Patent Application 62/210,033 filed on Aug. 26, 2015; the entire contents of which are incorporated herein by reference.

FIELD

Embodiments are generally related to a non-volatile memory device.

BACKGROUND

In the non-volatile memory device, it is desired to expand the memory area by reducing the driving circuit area. In addition to shrinking the memory cell size, it is a useful way to increase the storage capacity thereof. For example, a NAND-type flash memory comprises a driving circuit provided on the semiconductor body that is formed into a line-and-space pattern. The whole lines of the semiconductor body, however, may not be effectively utilized to form the circuit elements, because of the restrictions in the manufacturing process.

BRIEF DESCRIPTION OF THE DRAWINGS

FIGS. 6A to 10B are schematic cross-sectional views showing a manufacturing process of the non-volatile memory device according to the embodiment.

DETAILED DESCRIPTION

According to one embodiment, a non-volatile memory device comprises a memory area including a memory cell, and a peripheral area including a circuit that drives the memory cell. The circuit includes a first resistance element. The first resistance element includes a first conductive layer extending in a first direction, a first insulating layer provided on the first conductive layer, and a second conductive layer that includes a portion provided on the first insulating layer and an end portion in contact with the first conductive layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1:
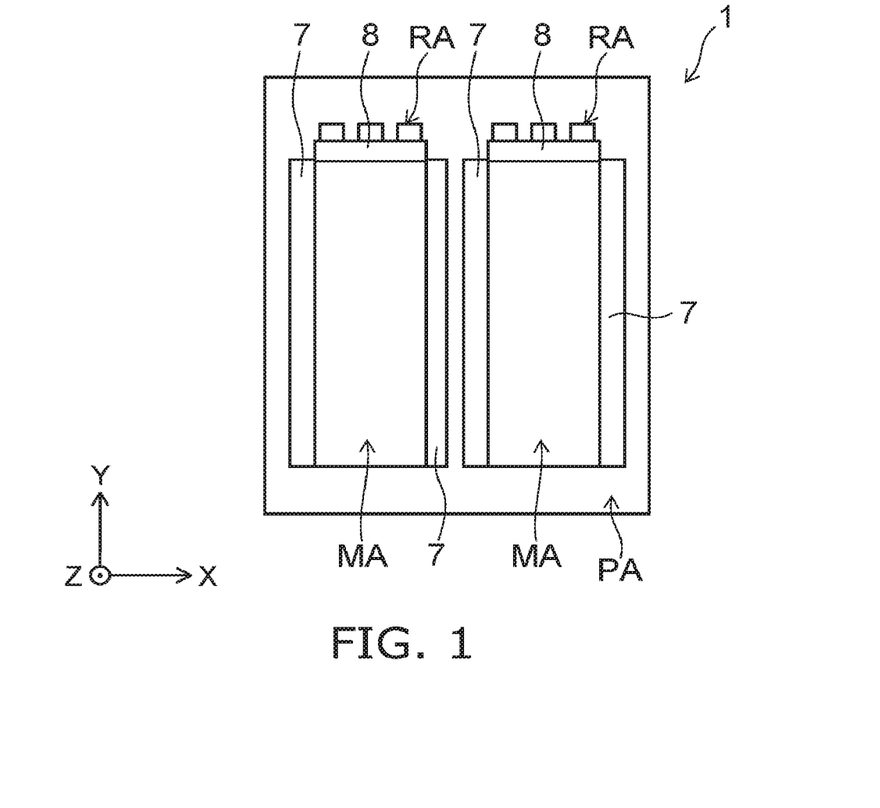
FIG. 1 is a schematic view showing a non-volatile memory device according to an embodiment.

FIG. 1 is a schematic view showing a chip surface of a non-volatile memory device 1 according to the embodiment. The non-volatile memory device 1 is, for example, a NAND-type flash memory. As shown in FIG. 1, the non-volatile memory device 1 includes memory areas MA and a peripheral area PA adjacent to the memory areas MA. The memory area MA includes a plurality of memory cells. In the peripheral area PA, for example, a core circuit, such as a row decoder 7 and a sense amplifier 8, and a peripheral circuit, such as an input/output circuit and a voltage generating circuit, are provided. Moreover, the peripheral circuit includes, for example, resistance element portions RA in each of which a plurality of resistance elements are disposed.

Figure 2:
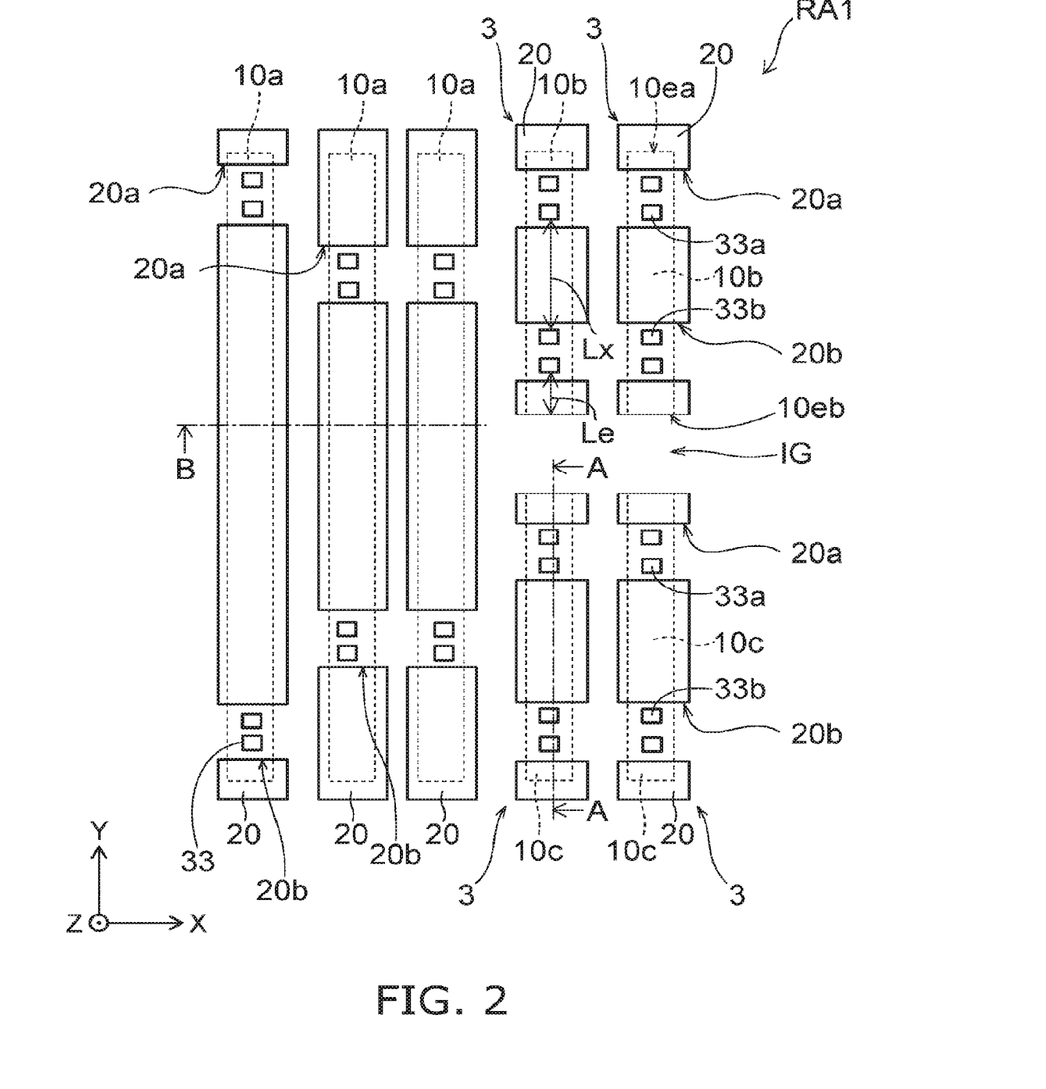
FIG. 2 is a schematic plan view showing a part of a driving circuit in the non-volatile memory device according to the embodiment.

FIG. 2 is a schematic plan view showing a resistance element portion RA1 provided in the non-volatile memory device 1. The resistance element portion RA1 includes a plurality of first conductive layers (hereinafter, conductive layers 10a, 10b, and 10c) and a second conductive layer (hereinafter, a conductive layer 20). The conductive layer 20 is provided on the conductive layers 10a, 10b, and 10c. An insulating layer 40 (not shown in FIG. 2) is provided between the conductive layer 20 and each of the conductive layers 10a, 10b, and 10c.

As shown in FIG. 2, the conductive layers 10a, 10b, 10c, and 20 are formed into a stripe pattern extending in a first direction (hereinafter, the Y-direction). The conductive layers 10b and 10c are aligned in the Y-direction. A gap IG is provided between the conductive layer 10b and the conductive layer 10c. The gap IG is provided to separate the conductive layer 10b and the conductive layer 10c from each other in the Y-direction.

Cutout portions 20a and 20b are provided in the conductive layer 20. The cutout portion 20a and the cutout portion 20b are separately provided in the Y-direction. Contact plugs 33a are provided in the cutout portion 20a. Contact plugs 33b are provided in the cutout portion 20b. The contact plugs 33a and 33b each extend through the insulating layer 40 (see FIG. 4A) so as to be electrically connected to the conductive layer 10a, 10b, or 10c.

Although two contact plugs 33 are provided in each of the cutout portions 20a and 20b in this example, the embodiment is not limited to this example. For example, one contact plug 33 or three or more contact plugs 33 may be provided in each of the cutout portions 20a and 20b.

In the specification, there are some cases where the conductive layers 10a, 10b and 10c are individually expressed, and other cases where the conductive layers 10a, 10b, and 10c are collectively expressed as the conductive layers 10 or the conductive layer 10. Other components are also expressed in a similar manner.

Figure 3:
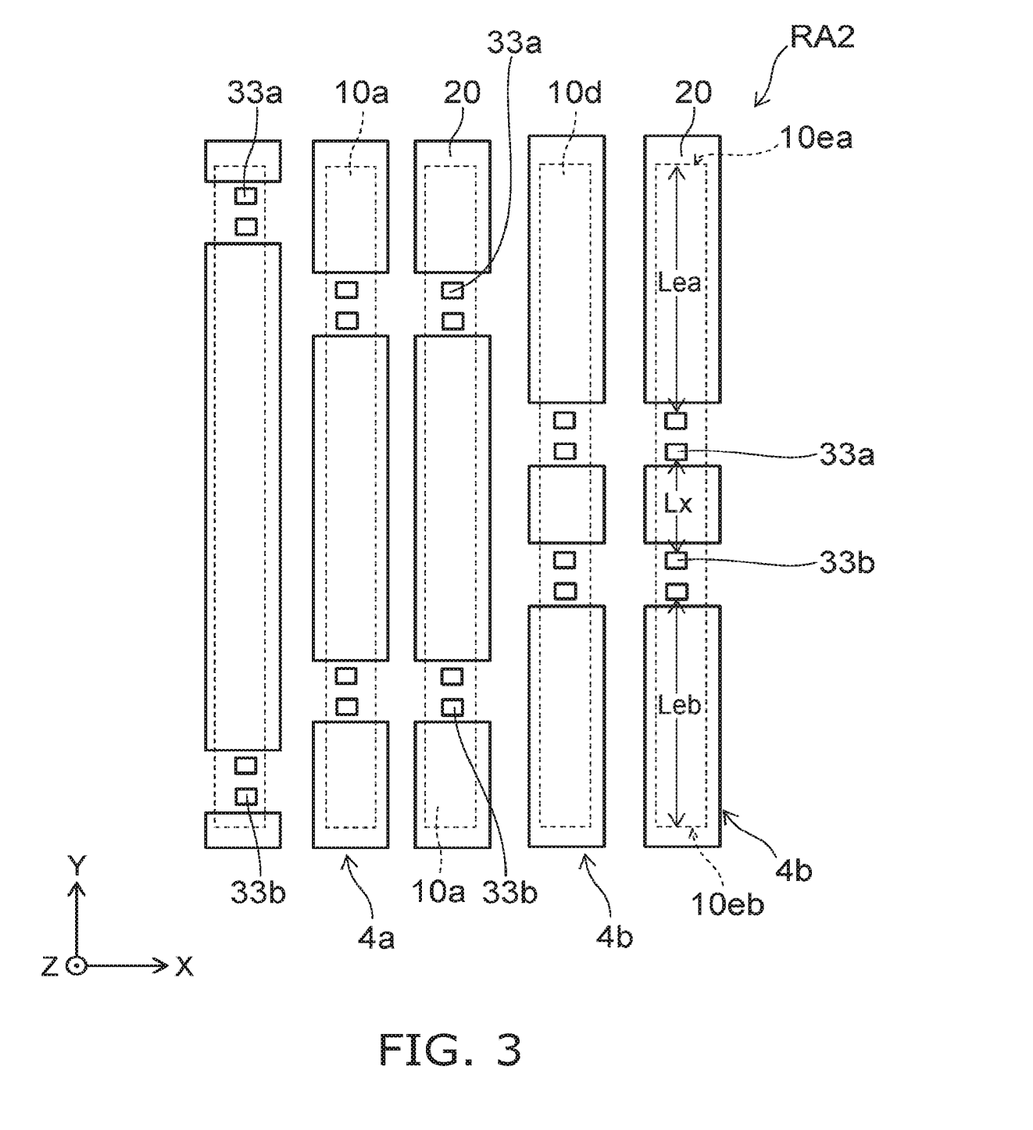
FIG. 3 is a schematic plan view showing a part of a driving circuit in a non-volatile memory device according to a comparable example.

FIG. 3 is a schematic plan view showing a resistance element portion RA2 according to a comparative example.

The resistance element portion RA2 includes conductive layers 10a, 10d, and 20. The conductive layer 20 is provided on the conductive layers 10a and 10d. An insulating layer 40 (not shown) is provided between the conductive layer 20 and each of the conductive layers 10a and 10d. The cutout portions 20a and 20b are provided in the conductive layer 20. The contact plugs 33a and 33b provided respectively in the cutout portions 20a and 20b are electrically connected to the conductive layer 10.

In the resistance element portion RA2, a plurality of conductive layers 10 having an equal length in the Y-direction is arrayed in the X-direction. A resistance element 4 is provided with each of the conductive layers 10. The electrical resistance value of the resistance element 4 is determined by the electrical resistance value between the contact plug 33a and the contact plug 33b. A resistance element 4 of a larger electrical resistance has a larger distance Lx from the contact plug 33a to the contact plug 33b, whereas a resistance element 4 of a smaller electrical resistance has a smaller distance Lx.

As shown in FIG. 3, a resistance element 4b provided with the conductive layer 10d has a smaller resistance value than that of a resistance element 4a provided with the conductive layer 10a, and the resistance element 4b has a smaller distance Lx. Thus, the conductive layer 10d has a larger distance Lea from the contact plug 33a to an end 10ea that is on the contact plug 33a side in the Y-direction. The conductive layer 10d also has a larger distance Leb from the contact plug 33b to an end 10eb that is on the contact plug 33b side in the Y-direction.

The area between the end 10ea of the conductive layer 10 and the contact plug 33a and the area between the end 10eb of the conductive layer 10 and the contact plug 33b are non-active, and do not contribute to the characteristics of the resistance element 4. Further, the parasitic capacitance of the resistance element 4 may increase, when a distance Lea or Leb from a contact plug 33 to an end 10e of the conductive layer 10 becomes larger, and provide an undesirable effect.

In contrast, in the resistance element portion RA1 shown in FIG. 2, resistance elements 3 having a low electrical resistance value are aligned in the Y-direction. Thereby, the non-active area is reduced, and the parasitic capacitance of the resistance element 3 may be reduced in the resistance element portion RA1. Thus, it is preferable to reduce the non-active area by providing a larger distance Lx from the contact plug 33a to the contact plug 33b than a distance Le from an end 10e of the conductive layer 10b to the contact plug 33a or 33b.

Figure 4A:
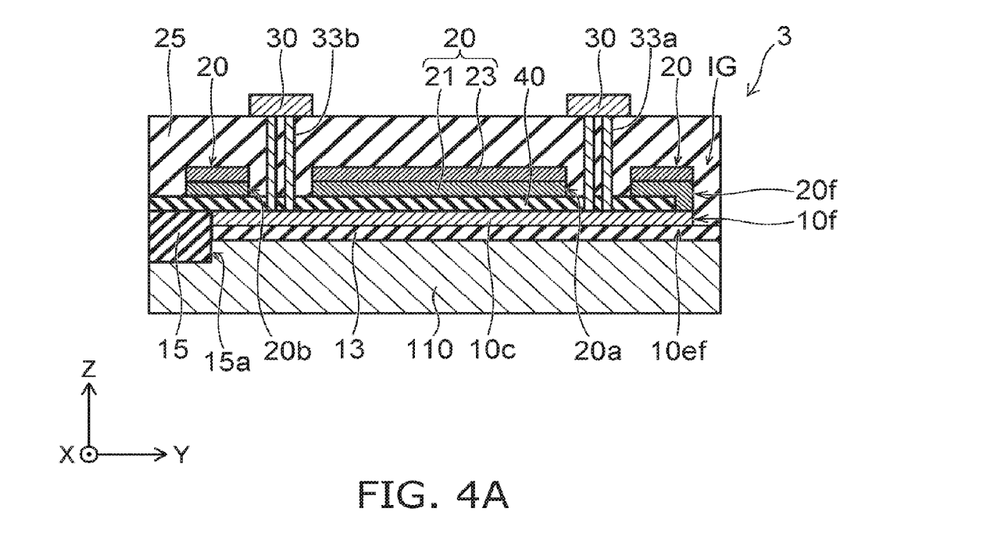
FIGS. 4A and 4B are schematic cross-sectional views showing a resistance element in the driving circuit according to the embodiment.
Figure 4B:
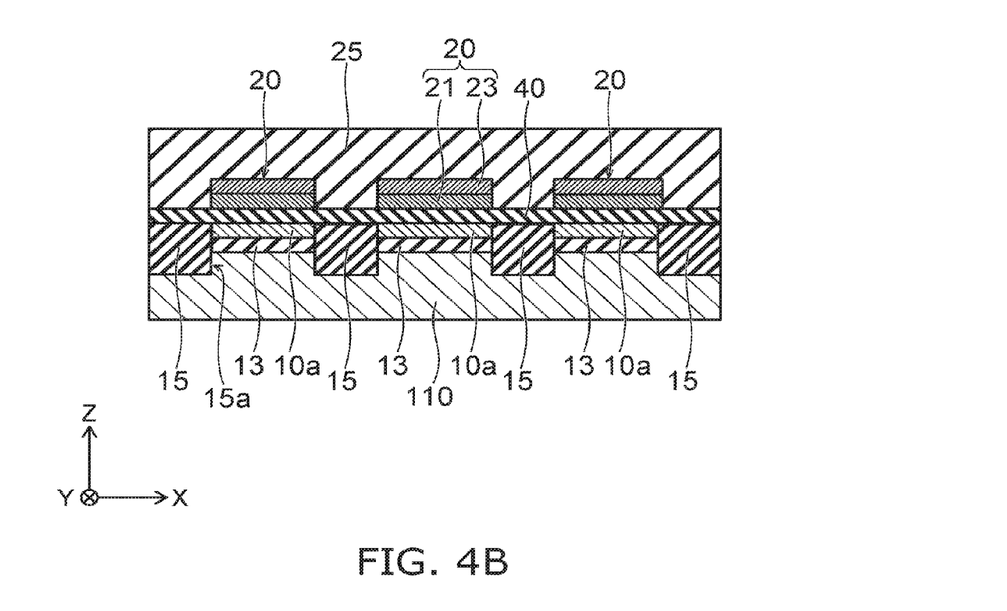

FIGS. 4A and 4B are schematic cross-sectional views showing the resistance element portion RA1. FIG. 4A is the cross-sectional view of the resistance element 3 along the line A-A shown in FIG. 2, and FIG. 4B is the cross-sectional view along the line B-B in FIG. 2.

As shown in FIG. 4A, the resistance element 3 is provided on a semiconductor body 110. The resistance element 3 includes an insulating layer 13, the conductive layer 10c, the insulating layer 40, and the conductive layer 20. The insulating layer 13 is provided on the semiconductor body 110. The conductive layer 10c is provided on the insulating layer 13. The semiconductor 110 body is, for example, a silicon substrate. The semiconductor 110 body may be a silicon layer provided on a substrate. The insulating layer 13 is, for example, a silicon oxide layer. The conductive layer 10c is, for example, a polysilicon layer.

As shown in FIGS. 4A and 4B, an STI (Shallow Trench Isolation) 15 is provided on the semiconductor body 110. The STI 15 defines the border of the resistance element portion RA1, and separates the conductive layers 10 from each other. The STI 15 shown in FIG. 4B extends in the Y-direction, and separates the conductive layers 10a from each other. The STI 15 is, for example, a silicon oxide layer.

The insulating layer 40 is provided on the conductive layer 10 and the STI 15, and covers the whole resistance element portion RA1 except for a part where the gap IG is provided. The insulating layer 40 is, for example, a silicon oxide layer.

The conductive layer 20 is selectively provided on the insulating layer 40. The conductive layer 20 is provided so as to cover the conductive layer 10 via the insulating layer 40. The conductive layer 20 includes, for example, a first layer 21 containing a semiconductor material and a second layer containing a metal. The first layer 21 is, for example, a polysilicon layer provided on the insulating layer 40. The second layer 23 is provided on the first layer 21 and includes, for example, a tungsten layer. The second layer 23 may have a stacked structure of tungsten nitride and tungsten.

As shown in FIG. 4A, an end portion of the conductive layer 20 is in contact with an end portion 10ef of the conductive layer 10c at the part where the gap IG is provided. Further, an end face 10f of the conductive layer 10c and an end face 20f of the conductive layer 20 are exposed in a wall surface of the gap IG. The end faces 10f and 20f are provided, for example, in the same plane.

Further, an inter-layer insulating layer 25 is provided so as to cover the conductive layer 20 and the insulating layer 40. A part of the inter-layer insulating layer 25 is buried in the gap IG. The inter-layer insulating layer 25 is, for example, a silicon oxide layer.

Interconnects 30 are provided on the inter-layer insulating layer 25. The interconnects 30 and the conductive layer 10 are electrically connected via the contact plugs 33. The contact plugs 33 extend downward (a negative direction of Z-direction) through the inter-layer insulating layer 25 and the insulating layer 40 to contact the conductive layer 10. The contact plugs 33 are located inside the cutout portions 20a and 20b provided in the conductive layer 20.

Figure 5:
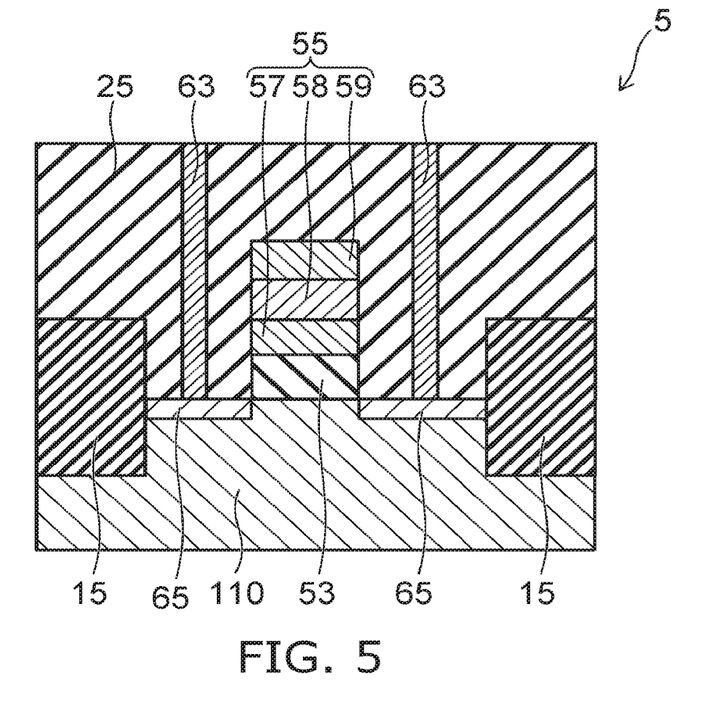
FIG. 5 is a schematic cross-sectional view showing a transistor element in the driving circuit according to the embodiment.

FIG. 5 is a schematic sectional view illustrating a transistor element 5. The transistor element 5 is provided in a portion different from the resistance element portion RA1 in the peripheral area PA. The transistor element 5 includes the semiconductor 110, a gate insulating layer 53, a gate electrode 55, and a diffusion layer 65.

The transistor element 5 is provided in a portion of the semiconductor body 110 different from the resistance element portion RA1. An STI 15 is provided on the semiconductor 110, and surrounds the transistor element 5. The gate insulating layer 53 is provided on the semiconductor 110. The gate insulating layer 53 is made of the same material, for example, as the insulating layer 13 of the resistance element portion RA1. The diffusion layer 65 is provided on both sides of the gate insulating layer 53. The diffusion layer 65 is provided on the semiconductor body 110, and has a conductivity type different from the semiconductor body 110.

The gate electrode 55 is selectively provided on the gate insulating layer 53. The gate electrode 55 includes a conductive layer 57, a conductive layer 58, and a metal layer 59. The conductive layer 57 is made of the same material as the conductive layer 10. The conductive layer 58 is made of the same material as the first layer 21 of the conductive layer 20. The metal layer 59 is made of the same material as the second layer of the conductive layer 20.

The inter-layer insulating layer 25 covers the gate insulating layer 53, the gate electrode 55, and the STI 15.

Contact plugs 63 are provided so as to extend in the inter-layer insulating layer 25 from an upper surface of the inter-layer insulating layer 25, and reach the diffusion layer 65.

Next, a method for manufacturing the non-volatile memory device 1 will be described with reference to FIGS. 6A to 10B. FIGS. 6A to 10B are schematic sectional views sequentially showing a manufacturing process of the non-volatile memory device 1.

Figure 6A:
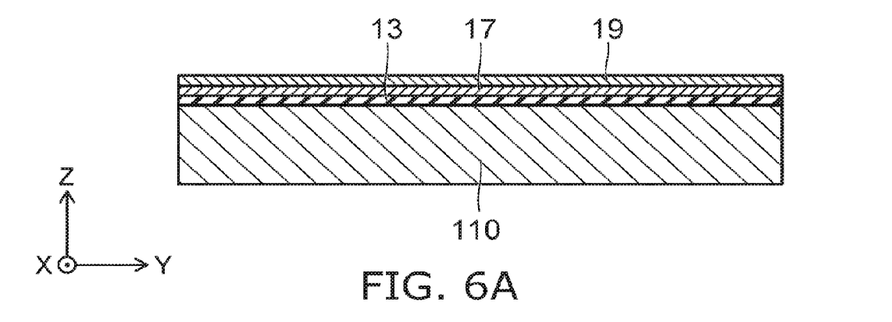

As shown in FIG. 6A, the insulating layer 13, a conductive layer 17 and an insulating layer 19 are sequentially formed on the semiconductor body 110. The semiconductor body 110 is, for example, a silicon substrate. The insulating layer 13 is, for example, a silicon oxide layer obtained by thermally oxidizing a surface of the silicon substrate. The conductive layer 17 is, for example, a polysilicon layer deposited on the insulating layer 13 using a CVD (Chemical Vapor Deposition) method. The insulating layer 19 is, for example, a silicon nitride layer, which is formed using an LPCVD (Low Pressure CVD) method.

Figure 6B:
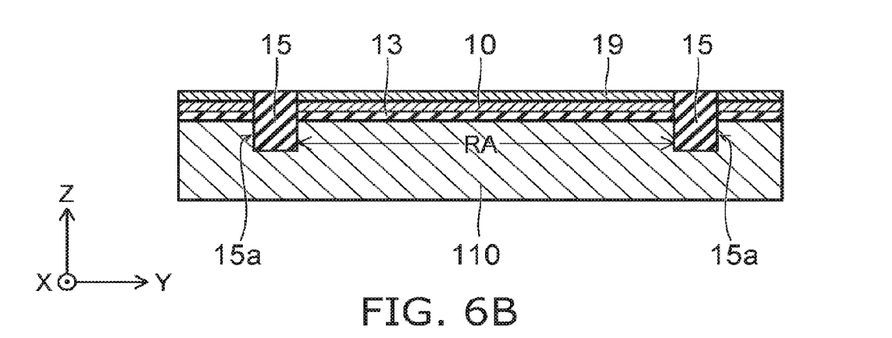

As shown in FIG. 6B, the STI 15 is formed on the semiconductor body 110. For example, trenches 15a are formed from an upper surface of the insulating layer 19 so as to have a depth extending into the semiconductor 110, and a silicon oxide layer is formed to fill the trenches 15a. For example, a silicon oxide layer is formed to cover the insulating layer 19, and parts of the silicon oxide layer are embedded in the trenches 15a. Subsequently, the silicon oxide layer is removed, for example, using CMP (Chemical Mechanical Polishing), leaving the parts of the silicon oxide layer in the trenches 15a. At this time, the insulating layer 19 acts as a stopper layer for CMP, thereby preventing the conductive layer 17 from being polished. The STI 15 defines, for example, the border of the resistance element portion RA, and divides the conductive layer 17 into the conductive layers 10 with a stripe pattern.

Figure 6C:
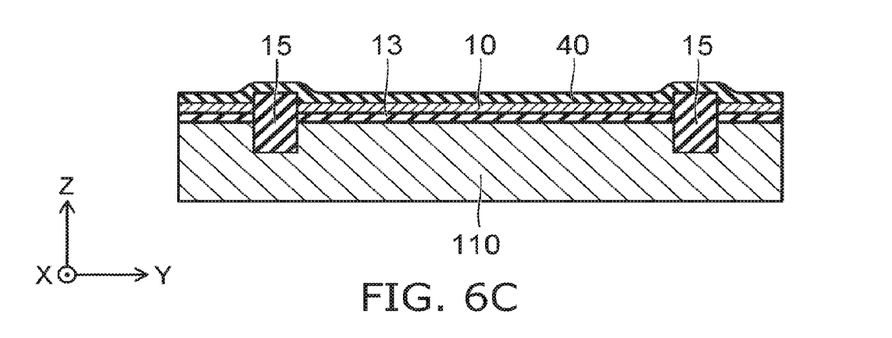

As shown in FIG. 6C, the insulating layer 40 is formed to cover the conductive layer 10 and the STI 15. The insulating layer 19 is selectively removed before the insulating layer 40 is formed. The insulating layer 19 may be selectively removed, for example, by the wet etching using phosphoric acid. The insulating layer 40 is, for example, a silicon oxide layer that is formed using a CVD method.

Figure 7A:
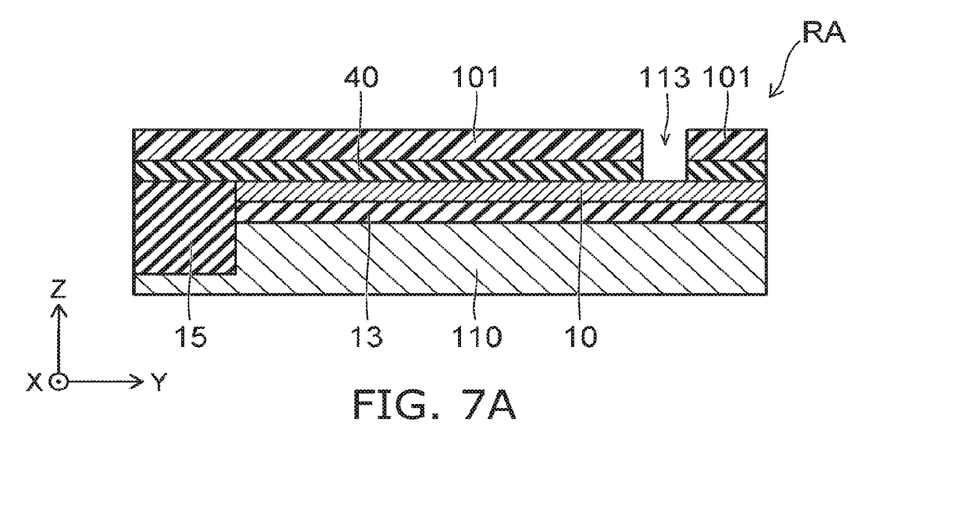
Figure 7B:
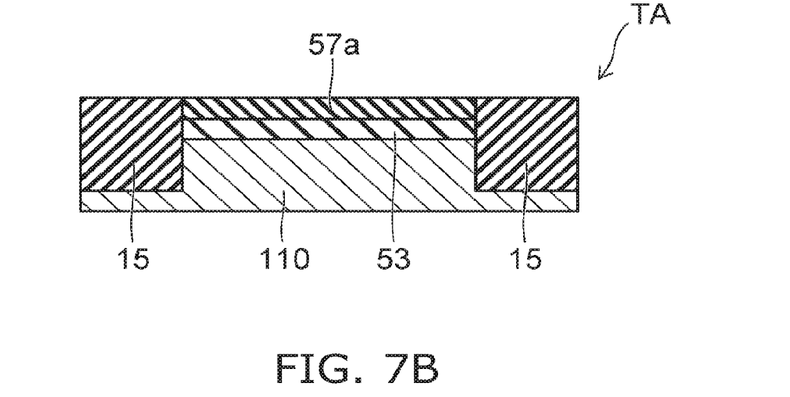

Next, FIG. 7A is a schematic view showing a cross-section of the resistance element portion RA, and FIG. 7B is a schematic view showing a cross-section of a portion where the transistor element 5 is provided (hereinafter, a transistor portion TA) in the peripheral area. Here, the STI 15 is illustrated for convenience to have a surface at the same level as a surface of the conductive layer 10. The SIT 15 may have a surface at a level higher than the surface of the conductive layer 10 as shown in FIG. 6C. Hereinafter, FIGS. 8A to 10B also show cross-sections of the resistance element portion RA and the transistor portion TA.

As shown in FIG. 7A, a resist mask 101 is formed to cover the insulating layer 40, and then, an opening 113 is formed in the insulating layer 40 using the resist mask 101. The conductive layer 10 is exposed at a bottom surface of the opening 113. The resist mask 101 covers the whole resistance element portion RA except for a portion where the opening 113 is formed. As shown in FIG. 7B, the resist mask 101 is formed not to cover the transistor portion TA, and thus, a part of the insulating layer 40 formed on a conductive layer 57a and STIs 15 is removed in the transistor portion TA, while the opening 113 is formed.

Figure 8A:
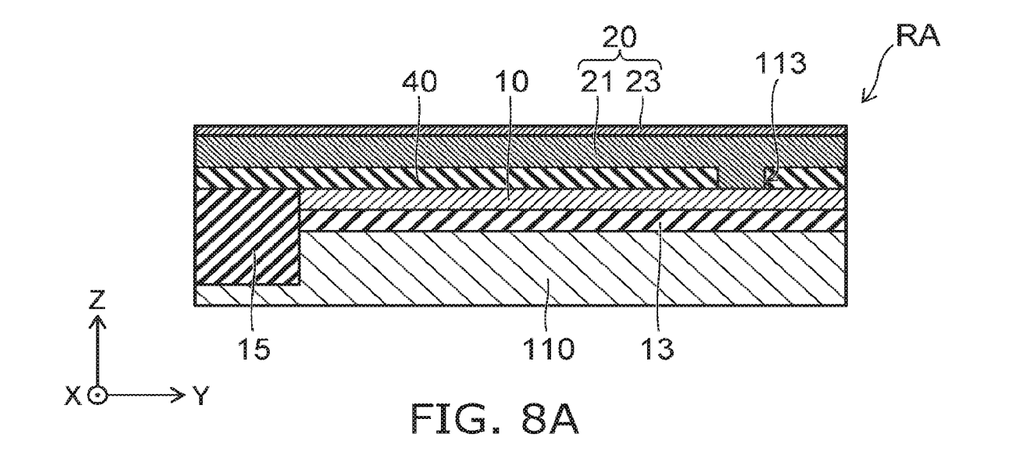
Figure 8B:
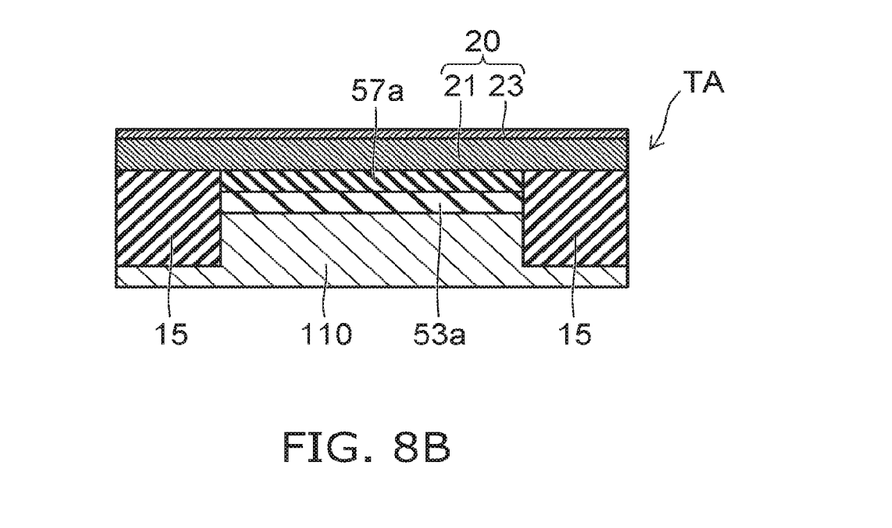

As shown in FIGS. 8A and 8B, the conductive layer 20 is formed respectively on the insulating layer 40 and the conductive layer 57a. As shown in FIG. 8A, the conductive layer 20 covers the insulating layer 40, and includes the first layer 21 and the second layer 23 formed on the first layer 21. A part of the first layer 21 is embedded in the opening 113, and is in contact with the conductive layer 10. As shown in FIG. 8B, the first layer 21 is directly deposited on the conductive layer 57a in the transistor portion TA. The first layer 21 is, for example, a polysilicon layer that is deposited using a CVD method. The second layer 23 is, for example, a tungsten layer that is deposited using a CVD method.

Figure 9A:
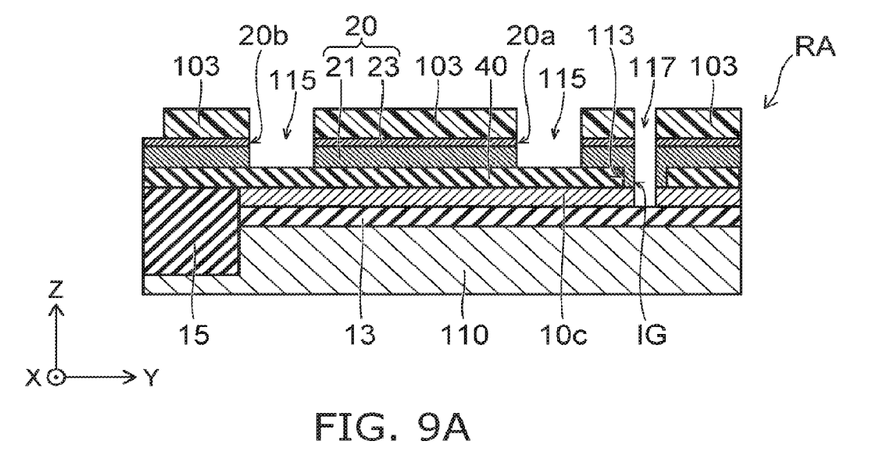

As shown in FIG. 9A, the conductive layer 20 is selectively removed on the insulating layer 40. Further, the conductive layers 10 and 20 are selectively removed at a portion where the insulating layer 40 is selectively removed in the resistance element portion RA. For example, the conductive layer 20 and the conductive layer 10 are selectively removed using a resist mask 103. The conductive layers 10 and 20 are etched, for example, using RIE (Reactive Ion Etching). The conductive layers 10 and 20 are removed, for example, under the condition where an etching rate of polysilicon becomes larger than an etching rate of a silicon oxide layer.

As shown in FIG. 9A, the resist mask 103 includes openings 115 and 117 in the resistance element portion RA. Thereby, openings 20a and 20b are formed in the conductive layer 20. Further, the gap IG is formed to extend through the part embedded in the opening 113 of the insulating layer 40.

Figure 9B:
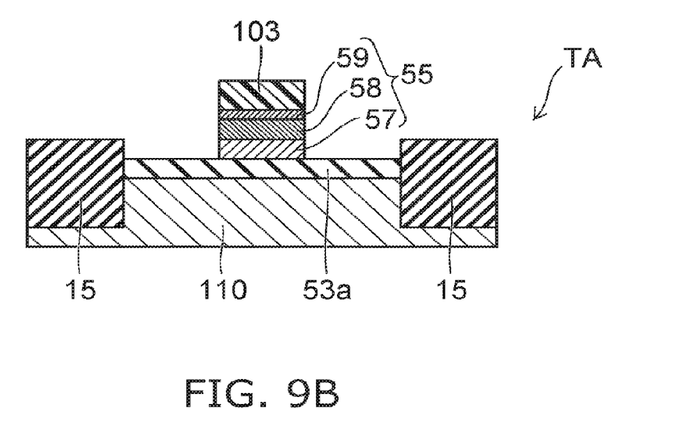

As shown in FIG. 9B, the resist mask 103 covers a portion where the gate electrode 55 is formed in the transistor portion TA. Thereby, the gate electrode 55 is formed on an insulating layer 53a. The insulating layer 53a acts as the gate insulating layer 53.

Further, the insulating layer 53a is removed, for example, using RIE, and the diffusion layer 65 is formed on both sides of the gate electrode 55. The diffusion layer 65 is formed, for example, by n-type impurities which are ion-implanted into a surface of the semiconductor body 110.

Figure 10A:
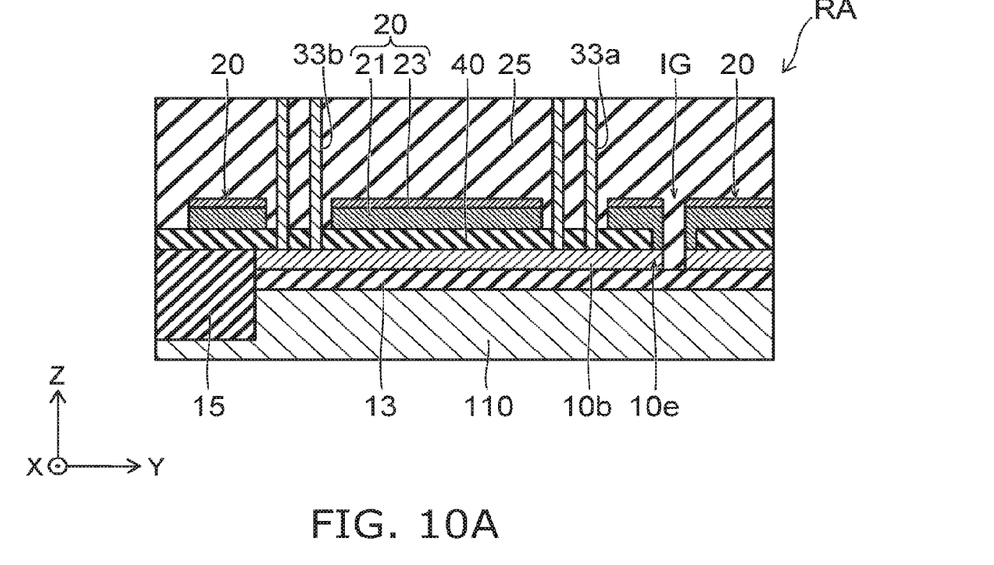
Figure 10B:
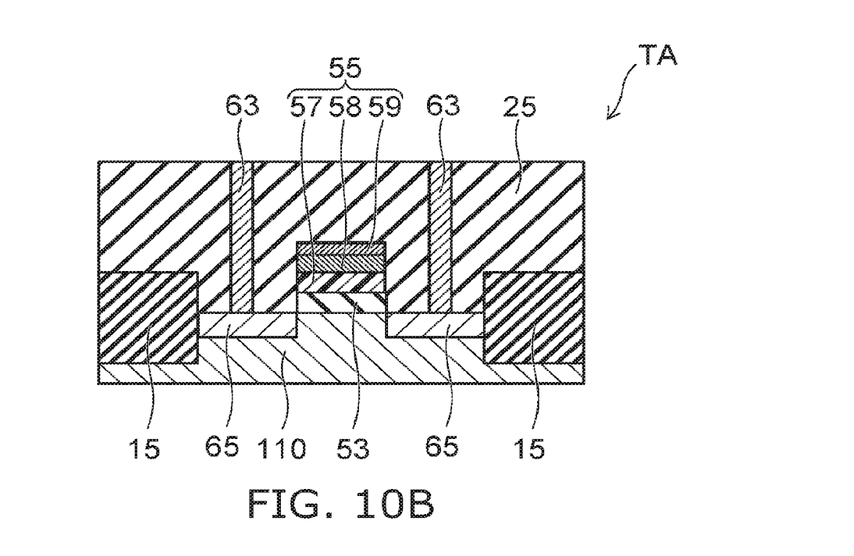

As shown in FIGS. 10A and 10B, the inter-layer insulating layer 25 is formed to cover the resistance element portion RA and the transistor portion TA. The inter-layer insulating layer 25 is, for example, a silicon oxide layer that is formed using a CVD method.

Further, the contact plugs 33a, 33b and 63 are formed in the inter-layer insulating layer 25. As shown in FIG. 10A, the contact plugs 33a and 33b extend through the inter-layer insulating layer 25 and the insulating layer 40, and reach the conductive layer 10. As shown in FIG. 10B, the contact plugs 63 extend through the inter-layer insulating layer 25, and reach the diffusion layer 65. The contact plugs 33a, 33b and 63 include, for example, tungsten. Further, the contact plugs 33a, 33b and 63 may include, for example, a barrier metal including titanium (Ti) and titanium nitride (TiN) stacked together and a tungsten layer formed on the barrier metal.

Subsequently, the interconnects 30 are formed on the inter-layer insulating layer 25 to complete a driving circuit in the peripheral area PA. Further, a memory cell array is formed on the memory area MA to complete the non-volatile memory device 1.

Figure 11:
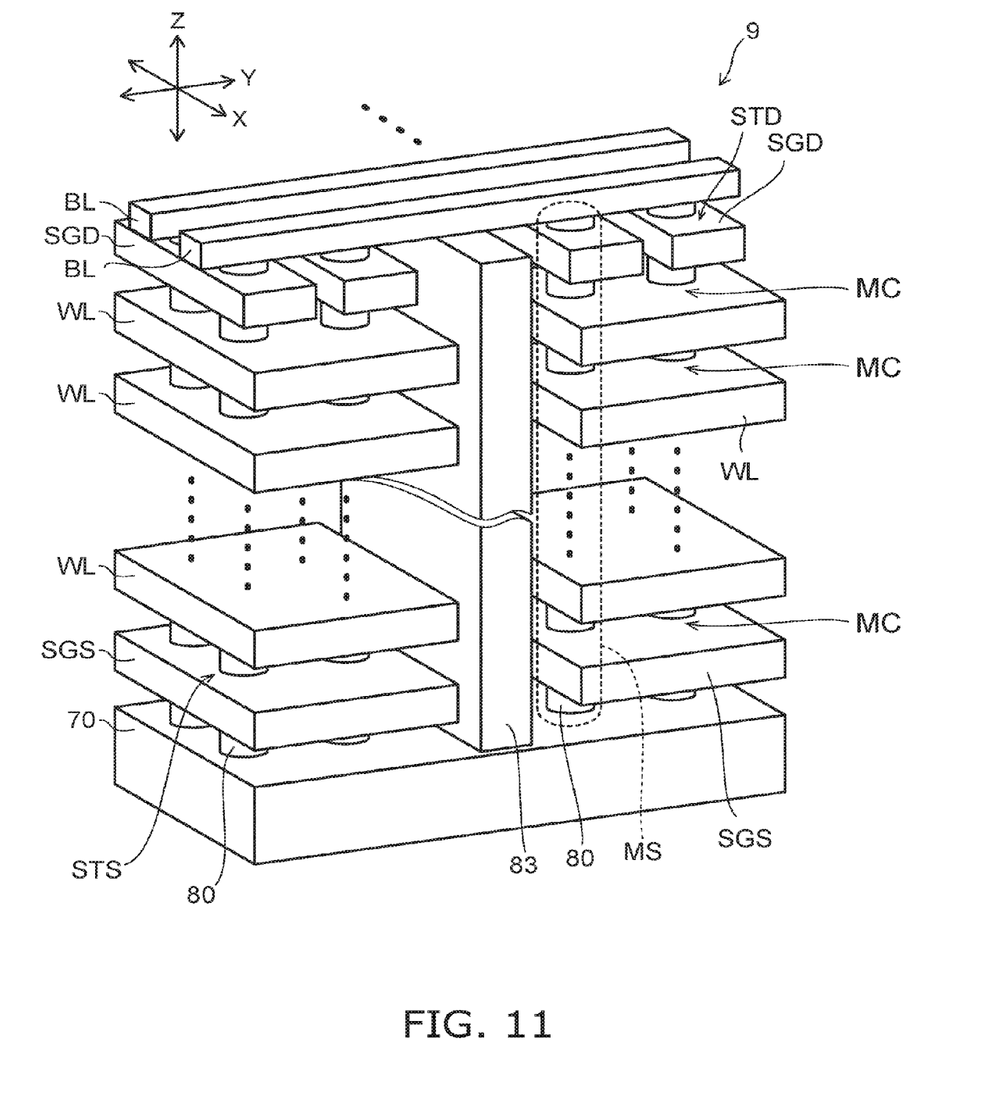
FIG. 11 is a schematic perspective view showing an example of a memory cell array according to the embodiment.

FIG. 11 is a perspective view schematically illustrating a memory cell array 9 according to the embodiment. The memory cell array 9 includes a plurality of memory cells MC that is three-dimensionally disposed, and is provided on the memory area MA.

As shown in FIG. 11, the memory cell array 9 includes a plurality of word lines WL provided on a source layer 70, and semiconductor bodies 80 extending through the word lines WL in the Z-direction. The source layer 70 is provided on the semiconductor 110, for example, via an inter-layer insulating layer (not shown), which is provided on the semiconductor 110. The word lines WL are stacked in the Z-direction with an insulating layer (not shown) inserted therebetween.

The memory cell MC is provided, at a portion where the semiconductor body 80 extends through a word line WL. The memory cell MC includes, for example, a charge storage layer provided between the word line WL and the semiconductor body 80. The memory cells MC are disposed in the Z-direction along the semiconductor body 80.

Select transistors ST are provided on both sides of the memory cells MC disposed along the semiconductor body 80 in the Z-direction. For example, a select gate SGD is provided on the word lines WL stacked in the Z-direction. Further, a select gate SGS is provided between the source layer 70 and the word line WL at the lowest level. The semiconductor 80 extends through the select gates SGS and SGD in the Z-direction. The select transistor STS is provided at a portion where the semiconductor 80 extends through the select gate SGS. The select transistor STD is provided at a portion where the semiconductor 80 extends through the select gate SGD.

The memory cell array 9 includes a NAND-type memory string MS in which the plurality of memory cells MC, the select transistor STS, and the select transistor STD are provided along the semiconductor 80. One end of the semiconductor 80 is electrically connected to the source layer 70. The other end of the semiconductor 80 is electrically connected to a bit line BL.

The bit line BL extends in the Y-direction over select gates SGD, and is electrically connected to, for example, the sense amplifier 8. The word lines WL and the select gates SGS and SGD extend in the X-direction, and are electrically connected, for example, to the row decoder 7.

A conductive body 83 is provided between the word lines WL adjacent to each other in the Y-direction, and is electrically connected to the source layer 70. The conductive body 83 is electrically connected to a source line (not shown), i.e. the conductive body 83 electrically connects a source line (not shown) and the source layer 70.

The memory cell array 9 described above is one example of the plurality of memory cells MC disposed on the memory area MA, and the embodiment is not limited thereto. For example, a crossbar-type three-dimensional memory cell array may be disposed on the memory area MA, or NAND-type memory strings may be two-dimensionally disposed in the memory are MA.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A non-volatile memory device comprising:
    a memory area including a memory cell; and
    a peripheral area including a circuit that drives the memory cell, the circuit including a first resistance element,
    the first resistance element including:
        a first conductive layer extending in a first direction,
        a second conductive layer provided on the first conductive layer, the second conductive layer having a first opening and a second opening aligned in the first direction with the first opening, and the first conductive layer having a first end close to the first opening and a second end close to the second opening,
        a first insulating layer extending between the first conductive layer and the second conductive layer, the first opening and the second opening of the second conductive layer being in communication with the first insulating layer, and the second conductive layer having an end portion in contact with the first conductive layer at the first end,
        a first contact plug provided in the first opening and extending through the first insulating layer to contact the first conductive layer, and
        a second contact plug provided in the second opening and extending through the first insulating layer to contact the first conductive layer,
    the first resistance element having a first distance from the first contact plug to the second contact plug, a second distance from the first contact plug to the first end, and a third distance from the second contact plug to the second end, and the first distance being larger than the second distance and the third distance.

2. The device according to claim 1, wherein the second conductive layer includes a first layer provided on the first insulating layer and a second layer provided on the first layer, the first layer containing a semiconductor material, and the second layer containing a metal.

3. The device according to claim 2, wherein the first conductive layer contains polysilicon; and the first layer of the second conductive layer contains polysilicon.

4. The device according to claim 2, wherein the second layer of the second conductive layer contains tungsten.

5. The device according to claim 1, wherein the first conductive layer and the second conductive layer have a stripe shape extending in the first direction.

6. The device according to claim 1, wherein the circuit further includes
    a second resistance element aligned in the first direction with the first resistance element, and
    a second insulating layer provided between the first resistance element and the second resistance element
the first end of the first conductive layer and the end portion of the second conductive layer are in contact with the second insulating layer.

7. The device according to claim 6, wherein the first conductive layer has a first end surface at the first end; and
the second conductive layer has a second end surface at the end portion; the second end surface being provided in plane with the first end surface.

8. The device according to claim 1, wherein the circuit further includes a transistor element, the transistor element including:
    a first semiconductor body,
    a gate insulating layer provided on the first semiconductor body, and
    a gate electrode provided on the gate insulating layer and having a stacked structure that includes the first conductive layer and the second conductive layer.

9. The device according to claim 8, wherein
the first resistance element further includes
- a second semiconductor body, and
- a third insulating layer provided on the second semiconductor body, the first conductive layer is provided on the third insulating layer, and the gate insulating layer is made of a same material as a material of the third insulating layer.

* * * * *